United States Patent [19]

Chillara

[11] Patent Number: 5,627,405
[45] Date of Patent: May 6, 1997

[54] INTEGRATED CIRCUIT ASSEMBLY INCORPORATING AN ANISOTROPIC ELECCTRICALLY CONDUCTIVE LAYER

[75] Inventor: Satya Chillara, San Jose, Calif.

[73] Assignee: National Semiconductor Corporation, Santa Clara, Calif.

[21] Appl. No.: 503,302

[22] Filed: Jul. 17, 1995

[51] Int. Cl.⁶ ............................................. H01L 23/48
[52] U.S. Cl. .................. 257/668; 257/693; 257/697; 257/778; 361/760; 361/767
[58] Field of Search ........................... 257/666, 668, 257/693, 697, 698, 700, 713, 729, 737, 738, 778, 676; 361/767, 760

[56] References Cited

U.S. PATENT DOCUMENTS

| | | | |
|---|---|---|---|
| 4,832,455 | 5/1989 | Takeno et al. | 350/334 |
| 4,954,878 | 9/1990 | Fox et al. | 257/704 |
| 5,014,161 | 5/1991 | Lee et al. | 361/388 |
| 5,225,966 | 7/1993 | Basavanhally et al. | 361/406 |
| 5,289,346 | 2/1994 | Carey et al. | 257/778 |
| 5,291,062 | 3/1994 | Higgins, III | 257/693 |
| 5,318,651 | 6/1994 | Matsui et al. | 156/273.5 |

FOREIGN PATENT DOCUMENTS 8612072  3/1987  France ................................. 257/697

OTHER PUBLICATIONS

Hitachi Chemical Co., Ltd, Hitachi Anisotropic Conductive Film, Anisolm®, Tokyo, Japan.

*Primary Examiner*—Peter Toby Brown
*Attorney, Agent, or Firm*—Hickman Beyer & Weaver

[57] ABSTRACT

An integrated circuit assembly includes an integrated circuit chip having a plurality of input/output terminals arranged at a surface thereof, and an electrically conductive layer connected to such surface of the integrated circuit chip. The layer is electrically conductive in thickness and electrically insulative in width and length. The assembly may further include a dielectric substrate connected to the layer such that the layer electrically connects respective terminals of the integrated circuit chip to respective electrically conductive traces of the dielectric substrate. An array of contacts may be electrically connected to the traces of the dielectric substrate.

9 Claims, 2 Drawing Sheets

INTEGRATED CIRCUIT ASSEMBLY INCORPORATING AN ANISOTROPIC ELECCTRICALLY CONDUCTIVE LAYER

BACKGROUND OF THE INVENTION

The present invention relates generally to integrated circuits and methods of making the same. More particularly, an anisotropic electrically conductive layer is used to couple a die to traces and/or package contacts.

A reduced-scale integrated circuit assembly is frequently referred to as chip scale package (CSP), since the size of the package is about the size of the integrated circuit chip or die incorporated in the package.

There are a wide variety of integrated circuit packages that are currently available. By way of example, referring to FIG. 1, a typical Ball Grid Array (BGA) integrated circuit package generally indicated by the reference numeral 10 is shown. BGA package 10 includes a dielectric substrate 12, an integrated circuit die 14, an array of bonding wires 16, an encapsulating material 18, and an array of contacts or solder balls 20.

Substrate 12 is made from a rigid material capable of supporting the other components of the package during the assembly of the package. Integrated circuit die 14 includes a plurality of electrically conductive input/output terminals on its top surface. Substrate 12 includes a plurality of electrically conductive terminals on its top surface. Each of the bonding wires 16 electrically connects a respective one of the input/output terminals on the top surface of integrated circuit die 14 to a respective one of the terminals on the top surface of substrate 12. Substrate 12 further includes a plurality of electrically conductive contact terminal pads on its bottom surface, and a plurality of electrically conductive traces (not shown), each of which electrically connects a respective terminal on the top surface of substrate 12 to a respective contact terminal pad on the bottom surface of the substrate 12. Encapsulating material 18 encapsulates integrated circuit die 14, at least the top surface of substrate 12, and bonding wires 16. Contacts or solder balls 20 are attached to associated contact terminal pads on the bottom surface of substrate 12, thereby allowing external electrical elements to be electrically connected to integrated circuit die 14.

In the field of integrated circuits, attempts are continuously being made to reduce the size of the integrated circuit die and to simultaneously increase the number of circuits provided on the die. More sophisticated and smaller integrated circuit dies are advantageous since, by being smaller, they are more easily incorporated into devices which are able to perform more complex tasks due to the advanced sophistication of the dies. However, the advantages obtained by decreasing the size of the die may be partially or wholly lost if the package or assembly which incorporates the die is excessively large or cumbersome. The conventional BGA package of FIG. 1 for example has packaging dimensions, i.e. the dimensions of the substrate 12 and encapsulating material 18, which are much larger than the dimensions of the integrated circuit die 14.

Furthermore, the pitch between the input/output terminals on the top surface of the IC die of the BGA package of FIG. 1 presently may not decrease below about 85–90 micron (µm) due to space constraints inherent with use of the bonding wires for electrically connecting the IC die input/output terminals to the substrate terminals. Accordingly, the density of input/output terminals on a given surface area of the IC die may not increase above a certain number in order to maintain the I/O terminal pitch at or above 85–90 micron (µm), which limits the degree of complexity of the IC die obtainable for a given die size.

Another type of currently available integrated circuit package employs a so-called flip-chip IC die. This die has been subjected to a wafer level process which includes connecting metallic bumps to the surface of the die, and reflowing the bumps in order to "redistribute" the I/O terminals on the surface of the die. The die is then turned over (hence the term flip-chip) so that the surface with the reflown bumps faces down to be connected directly with terminals on a PC board. Although the flip-chip IC package tends to be smaller in size than the previously described BGA package, the minimum I/O terminal pitch currently available while maintaining adequate electrical connection using the reflown bumps of the flip-chip die is about 200–250 microns (µm).

In view of the limitations of the currently available packaging, an improved arrangement for electrically coupling a die to associated contacts or leads would be desirable.

SUMMARY OF THE INVENTION

To achieve the foregoing and in accordance with one aspect of the invention, an anisotropic electrically conductive layer is connected to the surface of a integrated circuit chip or die which includes a plurality of input/output terminals. The anisotropic conductive layer is electrically conductive in directions which are substantially parallel to an electrically conductive axis, and is essentially electrically insulative in other directions. The anisotropic conductive layer provides an effective means for providing electrical connections to the input/output terminals of the die. The connection of the anisotropic conductive layer to the die advantageously allows to minimize the pitch between adjacent input/output terminals while still providing the ability to electrically couple the die to any type of electrical connection. By way of example, the anisotropic layer may be used to electrically couple the die directly to terminals on a printed circuit board (PCB), to leads of a lead frame, to traces on various substrate structures, etc. In some embodiments, the anisotropic conductive layer may take the form of a flexible, adhesive film, which is bondable to the integrated circuit chip by simultaneous application of heat and pressure.

In some embodiments, the integrated circuit assembly may include a dielectric substrate connected to the anisotropic conductive layer such that the anisotropic conductive layer is interposed or sandwiched between the dielectric substrate and the integrated circuit chip. The dielectric substrate includes a plurality of electrically conductive traces, and the connection of the anisotropic conductive layer between the integrated circuit chip and the dielectric substrate is such that respective input/output terminals of the integrated circuit chip are electrically connected to respective traces of the dielectric substrate through respective electrically conductive linear paths of the anisotropic conductive layer.

The sandwiched structure of the anisotropic conductive layer between the integrated circuit chip and the dielectric substrate advantageously allows to decrease the overall dimensions of the integrated circuit assembly, while still providing electrical connection between the input/output terminals of the integrated circuit with the traces of the dielectric substrate. In one embodiment, the peripheral dimensions of the integrated circuit chip, the interposed anisotropic conductive layer, and the dielectric substrate may be substantially identical. Electrical contacts may be provided on a surface of the dielectric substrate opposite to the layer, thereby for allowing external electrical elements to be electrically connected to the integrated circuit chip.

In a method aspect of the invention, a layer which is electrically conductive in thickness and electrically insulative in width and length is connected to a surface of an integrated circuit chip having a plurality of input/output terminals. In some method embodiments, a dielectric substrate having a plurality of electrically conductive traces may further be connected to the layer such that respective terminals of the integrated circuit chip are electrically connected, by the layer, to respective traces of the dielectric substrate. The connecting steps may include adhering the layer between the integrated circuit chip and the dielectric substrate, and subsequently simultaneously applying heat and pressure to areas of contact between the layer and the integrated circuit chip and the dielectric substrate.

According to a further aspect of the invention, an integrated circuit assembly is provided which includes a dielectric substrate having a plurality of electrically conductive traces, an integrated circuit chip having a plurality of input/output terminals, and an anisotropic conductive layer interposed between the dielectric substrate and the integrated circuit chip for electrically connecting respective traces of the dielectric substrate with respective terminals of the integrated circuit chip. In some embodiments, the surfaces of connection of the integrated circuit chip and the dielectric substrate to the layer may be arranged in substantially mutually parallel planes, and the anisotropic conductive layer may be adapted for conducting electricity substantially only parallel to one axis which is essentially perpendicular to the mutually parallel planes. In this case too, the peripheral dimensions of the integrated circuit chip, the interposed layer, and the dielectric substrate may all be substantially identical, so as to allow to decrease the overall dimensions of the integrated circuit assembly.

BRIEF DESCRIPTION OF THE DRAWINGS

The invention, together with further advantages thereof, may best be understood by reference to the following description taken in conjunction with the accompanying drawings in which.

DESCRIPTION OF THE PREFERRED EMBODIMENTS

Figure 1:
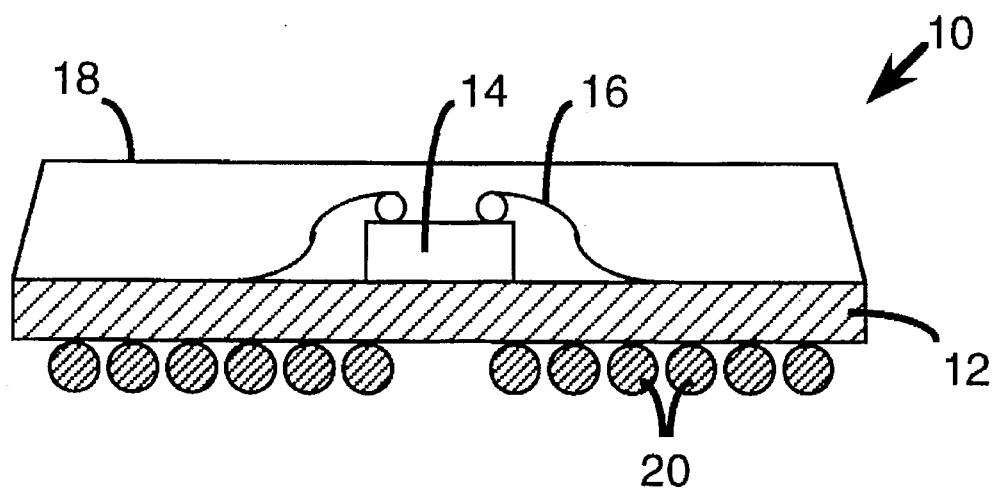
FIG. 1 is a diagrammatic cross sectional view of a conventional ball grid array integrated circuit package.
Figure 2:
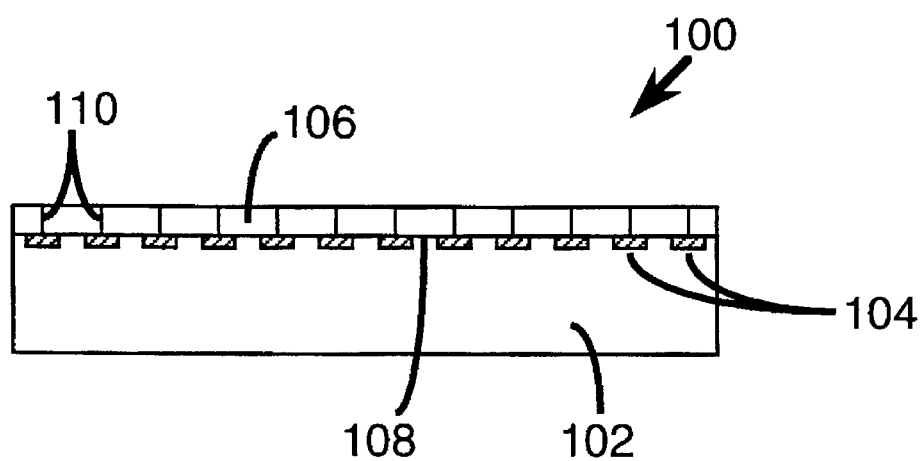
FIG. 2 is a diagrammatic cross sectional view of a first embodiment of an integrated circuit assembly in accordance with the present invention.

FIGS. 2–5 illustrate some embodiments of integrated circuit assemblies in accordance with the present invention wherein like components are represented by like reference numerals. Referring initially to FIG. 2, an integrated circuit assembly 100 according to one aspect of the present invention includes an integrated circuit chip 102, a plurality of input/output terminals 104, and an electrically conductive layer 106. The input/output terminals 104 are arranged at a surface 108 of the integrated circuit chip 102. Layer 106 is connected at surface 108 of IC chip 102.

Layer 106 is electrically conductive substantially along a single axis, while it is electrically insulative in other directions which are not parallel to the electrically conductive axis. Accordingly, layer 106 includes a plurality of paths 110 through which electricity may flow. The electrically insulative characteristic of layer 106 in directions non-parallel to the electrically conductive axis of layer 106 is such that electrically conductive paths 110 are mutually electrically insulated from one another. Thus electricity may flow in a single one of paths 110 without being disturbed by electricity flowing in other ones of paths 110.

In the particular embodiment of FIG. 2, surface 108 is essentially planar and paths 110 extend linearly and substantially perpendicularly with respect to surface 108. Layer 106 is essentially electrically conductive in thickness and electrically insulative in width and length.

Layer 106 may be an anisotropic flexible film having metallic particles dispersed such as to provide electrical conductivity in one dimension (typically thickness) and electrical insulation in the other dimension (typically the width and length of the film). A flexible film of this type may be obtained from Hitachi Chemical Co., Ltd., of Tokyo, Japan, known as ANISOLM® anisotropic conductive film. Such anisotropic film provides adequately insulated and electrically conductive paths 110 suitable for input/output terminals 104 which may be arranged on IC chip surface 108 with a pitch down to about at least 25 microns (µm). The ANISOLM® anisotropic film is adhesive, and after being properly positioned and adhered to surface 108 of IC chip 102, appropriate heat and pressure may be simultaneously applied to areas of contact between the film and chip surface 108 for a time sufficient to ensure proper connection of the film to the IC chip 102.

Electrically conductive paths 110, extending from input/output terminals 104 through layer 106, provide an effective means for providing electrical connections to input/output terminals 104 of integrated circuit chip 102 of the integrated circuit assembly. The electrical connections are made at the ends of linear paths 110 opposite to surface 108. Advantageously, the pitch between I/O terminals 104 arranged on surface 108 may be at least about 25 microns (µm).

Integrated circuit assembly 100 may be further connected in any number of ways with other components. For example, a lead frame may be positioned over layer 106, such that leads of the lead frame are selectively coupled to electrically conductive paths 110 of layer 106. Electrical connections would therefore be formed between respective leads of the lead frame, electrically conductive paths 110, and input/output terminals 104 of IC chip 102. The lead frame, electrically connected to layer 106, could then electrically couple IC chip 102 to other electrical elements.

Alternatively, layer 106 could be connected directly to a PCB such that electrical traces of the PCB are electrically connected to electrically conductive paths 110 of layer 106. In other embodiments of the invention, a dielectric substrate with electrically conductive traces may be attached to layer 106 such that the traces of the dielectric substrate are electrically coupled to respective conductive paths 110 of layer 106. Some examples of attaching dielectric substrates to layer 106 of IC assembly 100 follow hereinafter.

Figure 3:
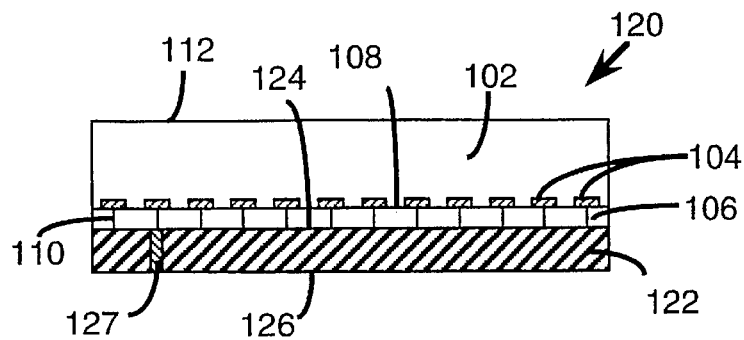
FIG. 3 is a diagrammatic cross sectional view of a second embodiment of an integrated circuit assembly in accordance with the present invention.

FIG. 3 shows an integrated circuit assembly in accordance with another aspect of the present invention, in which electrically conductive paths of an electrically conductive layer electrically connect input/output terminals of an integrated circuit chip with electrically conductive traces of a dielectric substrate. Integrated circuit assembly 120 includes integrated circuit chip 102, a plurality of input/output terminals 104, electrically conductive layer 106, a plurality of electrically conductive paths 110, and a dielectric substrate 122.

In addition to being connected to surface 108 of IC chip 102, layer 106 is also connected to the top surface 124 of dielectric substrate 122. Layer 106 is therefore interposed or sandwiched between IC chip 102 and substrate 122. Layer 106 may be connected to substrate 122 in a manner similar to that previously described for connecting layer 106 to IC chip 102, initially with positioning and adhesion, and subsequently with simultaneous heat and pressure application. In a preferred method of connecting layer 106 between IC chip 102 and substrate 122, layer 106 is first connected to IC chip 102 by simultaneous application of heat and pressure, and then substrate 122 is subsequently connected to layer 106 already connected to chip 102 by means of simultaneously applying heat and pressure. However, it is envisioned that the order of this connection may be reversed, or that alternatively one step of heat and pressure may be applied to a pre-tacked three-layered structure of IC chip 102, layer 106, and substrate 122.

Dielectric substrate 122 defines a plurality of electrically conductive traces (not shown) which may extend in dielectric substrate in a variety of ways. For example, electrically conductive traces of substrate 122 may include a first portion integral with the top surface 124 of substrate 122, a second portion passing through a via extending from the top surface 124 to the bottom surface 126 of substrate 122, and a third portion integral with the bottom surface 126 of substrate 122. Electrically conductive traces of substrate 122 may include a single portion passing through a via extending from the top surface 124 to the bottom surface 126 of substrate 122. FIG. 3 shows substantially planar surfaces 124 and 126, and vias for the electrically conductive traces may extend substantially perpendicular to the planar surfaces 124 and 126. The shape, position, and extension of the electrically conductive traces may be many, as will be appreciated by those skilled in the art.

Layer 106 is interposed and connected to IC chip 102 and substrate 122 such that respective I/O terminals 104 of IC chip 102 are electrically connected to respective trace terminal portions, arranged at upper surface 124, of the electrically conductive traces of substrate 122 by means of the electrically conductive paths 110 in layer 106. The preferred thickness of layer 106 ranges from about 16–22 microns (μm) while the preferred thickness of substrate 122 ranges from about 50–100 microns (μm).

In the particular embodiment of FIG. 3, surfaces 108 and 124 extend in respective planes which are substantially mutually planar, and the plurality of electrically conducting paths 110 of layer 106 extend essentially perpendicularly to surfaces 108 and 124. Therefore, the respective trace terminal portions arranged at upper surface 124 of substrate 122 are essentially arranged directly below the respective I/O terminals 104 of IC chip 102. Layer 106 is adapted for conducting electricity substantially only parallel to a single axis which is essentially perpendicular to the mutually parallel planar surfaces 108 and 124, while layer 106 is electrically insulated in other directions which are not parallel to the single electrically conductive axis.

Electrically conductive linear paths 110, extending from input/output terminals 104 through layer 106, together with electrically conductive traces 127 of dielectric substrate 122, provide an effective means for providing electrical connections to input/output terminals 104 of integrated circuit chip 102 of the integrated circuit assembly. In this instance, the electrical connections may be made at the terminal ends of the electrically conductive traces (i.e. terminal ends of the traces opposite to the trace terminal portions connected to paths 110 at surface 124) defined in substrate 122. It is envisioned that many types of electrical connections may be made at the trace terminal ends of substrate 122. For example, surface 126 may be attached directly to a PCB to electrically couple the trace terminal ends of substrate 122 to respective terminal ends of traces of the PCB. Alternatively, an array of contacts, for example a ball grid array of contacts, may be electrically coupled to the trace terminal ends of substrate 122, and the resulting IC assembly may be connected to other elements, for example a PCB, to electrically couple IC chip 102 to other electrical elements. In other embodiments, leads of a lead frame may be electrically coupled to the trace terminal ends of substrate 122. The leads of the lead frame could be electrically coupled, for example directly or with interposition of an array of contacts, to the trace terminal ends of substrate 122. Some examples of connecting arrays of contacts to trace terminal ends of substrate 122 follow hereinafter.

Figure 4:
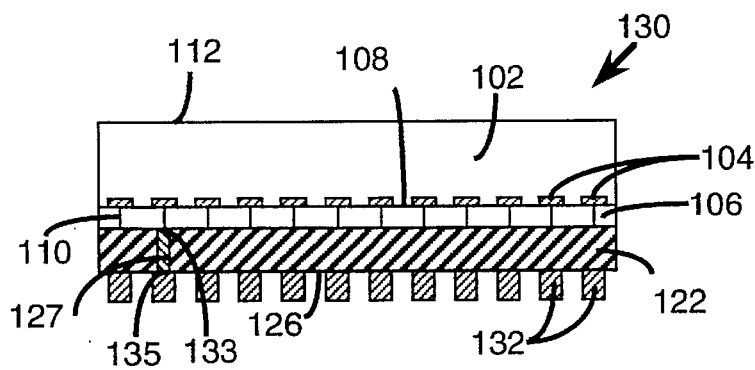
FIG. 4 is a diagrammatic cross sectional view of a third embodiment of an integrated circuit assembly in accordance with the present invention.

FIG. 4 shows an integrated circuit assembly in accordance with a further aspect of the present invention, in which electrically conductive paths of an electrically conductive layer electrically connect input/output terminals of an integrated circuit chip with electrically conductive traces of a dielectric substrate, and in which an array of electrical conducting contacts are connected to the electrically conductive traces of the substrate. Integrated circuit assembly 130 includes integrated circuit chip 102, a plurality of input/output terminals 104, electrically conductive layer 106, a plurality of electrically conductive paths 110, dielectric substrate 122, and an array of contacts 132.

While first terminal trace portions 133 of respective traces of substrate 122 are electrically connected to paths 110 at substrate surface 124, respective contacts of the array of contacts 132 are electrically connected to second terminal trace portions 135 of the respective traces. As seen in FIG. 4, the array of contacts 132 are arranged at bottom substrate surface 126 and therefore, this particular embodiment includes second terminal trace portions also arranged at bottom substrate surface 126. The electrically conductive traces extend between the top surface 124 and bottom surface 126 in substrate 122.

In the embodiment of FIG. 4, array of contacts 132 include solder columns (typically cylindrical) which are connected, preferably with a conventional solder material reflow method, at substrate bottom surface 126. In a preferred method of assembly, array of contacts 132 are connected at substrate bottom surface 126 before substrate 122 and layer 106 are mutually connected. However, it is envisioned that array of contacts 132 may be connected at substrate bottom surface after the step of connecting substrate 122 with layer 106. While array of contacts 132 is shown in FIG. 4 as including solder columns, array of contacts 132 may also include an array of solder balls or an array of conducting pins, as will be appreciated by those skilled in the art.

Figure 5:
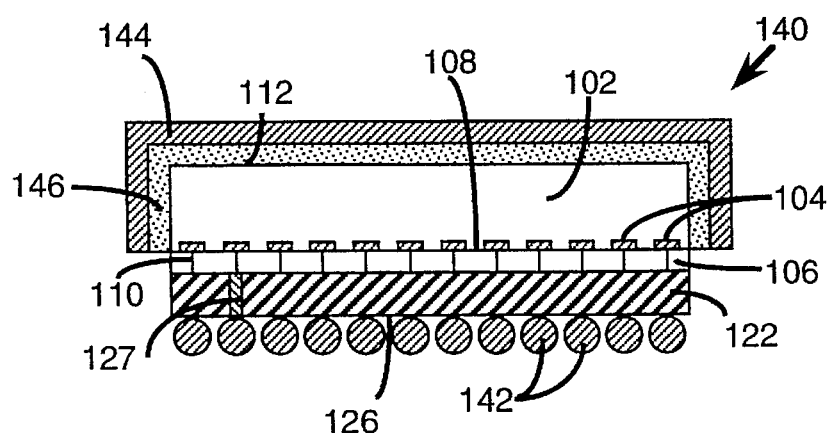
FIG. 5 is a diagrammatic cross sectional view of a fourth embodiment of an integrated circuit assembly in accordance with the present invention.

FIG. 5 shows an integrated circuit assembly according to a further aspect of the present invention. Integrated circuit assembly 140 includes integrated circuit chip 102, a plurality of input/output terminals 104, electrically conductive layer 106, a plurality of electrically conductive paths 110, dielectric substrate 122, an array of contacts 142, heat sink element 144, and potting material 146.

As a variation of the previously described structure of FIG. 4, array of contacts 142 include solder balls soldered at substrate bottom surface 126 and thereby connected to electrically conductive traces 127 in substrate 122. Additionally, heat sink element 144 (metallic enclosure) is arranged over the top surface 112 of IC chip 102. A conventional potting material 146, for example tape or epoxy, may be interposed between IC chip 102 and heat sink element 144, preferably over top surface 112 and the side surfaces of IC chip 102 for protection against contamination.

The invention may provide integrated circuit assemblies in which the array of bonding wires of the previously described Ball Grid Array (BGA) integrated circuit package are eliminated. Additionally, the peripheral dimensions of integrated circuit chip, interposed layer, and dielectric substrate may all be substantially identical, so as to allow to decrease the overall dimensions of the integrated circuit assembly.

Use of the electrically conductive layer 106 in accordance with the present invention also advantageously allows to reduce the pitch of the I/O terminals of the IC chip to about 25 micron (µm). That is, layer 106, as presently available for example as the ANISOLM® anisotropic conductive film, provides adequate electrical conductivity in electrically conductive paths 110 thereof to and from I/O terminals 104 which are mutually spaced apart about 25 microns (µm). Future developed electrically conductive layers of the type described herein may allow to even further decrease the I/O terminal pitch. An anisotropic conductive layer connected to a surface of a die including a plurality of I/O terminals permits the die to be connected to external electrical elements in any number of ways.

Although only a few embodiments of the present invention have been described, it should be understood that the present invention may be embodied in many other specific forms without departing from the spirit or scope of the invention. For instance, although the specification has described substantially planar IC chips, electrically conductive layers, and dielectric substrates, it is conceivable that other shapes of these elements may be used. For example, the flexible nature of the electrically conductive film would allow the film to be easily connected to non-planar surfaces, such as semi-spherical surfaces. Electrically conducting paths in the film would then extend radially from the semi-spherical surface. In addition, although the specification has taught electrically conductive paths of the electrically conductive layer which form substantially perpendicular intersection angles with the IC chip and with the dielectric substrate, it is envisioned that electrically conductive paths forming different intersection angles may be possible. Similarly, non-linear electrically conductive paths may be employed. Furthermore, it is contemplated that the combination of an anisotropic electrically conductive layer connected with an integrated circuit chip may have various advantageous uses, for example when employed to connect the input/output terminals of the IC chip to integrated circuit package lead frames, or for connecting the input/output terminals of the IC chip directly to traces of substrates or PCBs, or for connecting the input/output terminals to an array of electrical contacts, or conceivably for interconnecting input/output terminals of two or more mutually facing IC chips, or even when employed in a conventional BGA integrated circuit package as described previously thereby connecting electrical wires to the electrically conductive paths of the anisotropic conductive layer. Furthermore, while the drawings illustrate dies, anisotropic layers, and substrates having substantially similar external dimensions, it will be appreciated that some embodiments may include the use of dies and anisotropic conductive layers of different size.

Therefore, the present examples are to be considered as illustrative and not restrictive, and the invention is not to be limited to the details given herein, but may be modified within the scope of the appended claims.

What is claimed is:

1. An integrated circuit assembly, comprising:

(a) a dielectric substrate having first and second surfaces and a plurality of electrically conductive traces, wherein first terminal trace portions of said plurality of electrically conductive traces are arranged on the first surface of the dielectric substrate and second terminal trace portions of said plurality of electrically conductive traces are arranged on the second surface of the dielectric substrate, the first terminal trace portions being electrically connected to the second terminal trace portions of said electrically conductive traces, the second surface further including an array of contacts that are electrically connected to the second terminal trace portions;

(b) an integrated circuit chip having a first surface having a plurality of input/output terminals thereon, the integrated circuit chip having a footprint that is substantially the same size as said dielectric substrate; and (c) an anisotropic electrically conductive layer interposed between said first surface of the dielectric substrate and said first surface of the integrated circuit chip for electrically connecting respective traces of said plurality of electrically conductive traces of said dielectric substrate with respective terminals of said plurality of input/output terminals of said integrated circuit chip, wherein said anisotropic electrically conductive layer provides a plurality of electrically conductive paths formed by a plurality of electrically conductive particles randomly dispersed within said anisotropic electrically conductive layer.

2. An integrated circuit assembly according to claim 1 wherein said first surface of said dielectric substrate and said first surface of said integrated circuit chip are arranged in substantially mutually parallel planes, and wherein said anisotropic conductive layer is adapted for conducting electricity in directions substantially only parallel to one axis which is essentially perpendicular to said mutually parallel planes.

3. An integrated circuit assembly according to claim 2 wherein said anisotropic conductive layer is electrically conductive in thickness and electrically insulative in width and length.

4. An integrated circuit assembly according to claim 3 wherein said anisotropic conductive layer is a film adapted for connection to said dielectric substrate and to said integrated circuit chip by means of simultaneous heat and pressure application.

5. An integrated circuit assembly according to claim 1 wherein said array of contacts comprise an array of solder balls.

6. An integrated circuit assembly according to claim 1 wherein said array of contacts comprise an array of solder columns.

7. An integrated circuit assembly according to claim 1 wherein said array of contacts comprise an array of pins.

8. An integrated circuit assembly according to claim 3 further comprising a heat sink element arranged over said integrated circuit chip.

9. An integrated circuit assembly according to claim 8 further comprising a potting material interposed between said heat sink element and said integrated circuit chip.

* * * * *